(12) United States Patent
Wieland et al.

(10) Patent No.: US 8,921,758 B2
(45) Date of Patent: Dec. 30, 2014

(54) MODULATION DEVICE AND CHARGED PARTICLE MULTI-BEAMLET LITHOGRAPHY SYSTEM USING THE SAME

(75) Inventors: Marco Jan-Jaco Wieland, Delft (NL); Teunis Van De Peut, Leusden (NL); Alexander Hendrik Vincent Van Veen, Rotterdam (NL); Remco Jager, Rotterdam (NL); Stijn Willem Herman Karel Steenbrink, The Hague (NL); Ralph Van Melle, Hellevoetsluis (NL); Henk Derks, Waalre (NL)

(73) Assignee: Mapper Lithography IP B.V., Delft (NL)

( * ) Notice: Subject to any disclaimer, the term of this patent is extended or adjusted under 35 U.S.C. 154(b) by 378 days.

(21) Appl. No.: 13/281,559

(22) Filed: Oct. 26, 2011

(65) Prior Publication Data
US 2012/0273658 A1 Nov. 1, 2012

Related U.S. Application Data

(60) Provisional application No. 61/406,675, filed on Oct. 26, 2010, provisional application No. 61/479,263, filed on Apr. 26, 2011, provisional application No. 61/477,228, filed on Apr. 20, 2011.

(51) Int. Cl.
*H01J 3/14* (2006.01)
*H01J 5/16* (2006.01)
*H01J 37/04* (2006.01)
*B82Y 10/00* (2011.01)
*B82Y 40/00* (2011.01)
*H01J 37/22* (2006.01)
*H01J 37/317* (2006.01)

(52) U.S. Cl.
CPC ............... *H01J 37/045* (2013.01); *B82Y 10/00* (2013.01); *B82Y 40/00* (2013.01); *H01J 37/22* (2013.01); *H01J 37/3174* (2013.01); *H01J 37/3177* (2013.01); *H01J 2237/0437* (2013.01)
USPC ................. 250/216; 250/227.11; 250/492.22; 355/67; 355/71

(58) Field of Classification Search
USPC ............ 250/216, 221, 548, 396 R, 397, 398, 250/400, 492.2, 492.22, 492.3, 227.11; 355/67, 71
See application file for complete search history.

(56) References Cited

U.S. PATENT DOCUMENTS

| | | | |
|---|---|---|---|
| 5,872,618 A * | 2/1999 | Nagayama et al. | ............. 355/53 |
| 6,897,458 B2 | 5/2005 | Wieland | |
| 7,084,414 B2 | 8/2006 | Wieland | |
| 7,129,502 B2 | 10/2006 | Kruit | |
| 2004/0135983 A1 | 7/2004 | Wieland | |

OTHER PUBLICATIONS

P. Kruit: "The role of MEMS in maskless lithography", Microelectronic Engineering, Elsevier Publishers B.V., Amsterdam, NL, vol. 84, No. 5-8, May 6, 2007, pp. 1027-1032.
E. Slot et al: "Mapper High Throughput Maskless Lithography", SPIE, PO Box 10 Bellingham WA 98227-0010 USA, vol. 6921, Mar. 21, 2008, pp. 69211P-1-69211P-9.

* cited by examiner

*Primary Examiner* — Francis M Legasse, Jr.
(74) *Attorney, Agent, or Firm* — Hoyng Monegier LLP; David P. Owen

(57) ABSTRACT

The invention relates to a charged-particle multi-beamlet lithography system. The system comprises a beam generator for generating a plurality of beamlets, a beamlet blanker array for patterning the plurality of beamlets, an optical fiber arrangement, and a projection system. The beamlet blanker array comprises a substrate provided with a first area comprising one or more modulators and a second area free of modulators. The beamlet blanker array comprises one or more light sensitive elements, electrically connected to the one or more modulators, and arranged to receive light beams carrying pattern data. The optical fiber arrangement comprises a plurality of optical fibers for guiding the light beams carrying pattern data towards the one or more light sensitive elements. The projection of the optical fiber arrangement onto a surface of the beamlet blanker array in a direction perpendicular to the surface falls entirely within the second area.

30 Claims, 10 Drawing Sheets

MODULATION DEVICE AND CHARGED PARTICLE MULTI-BEAMLET LITHOGRAPHY SYSTEM USING THE SAME

BACKGROUND OF THE INVENTION

1. Field of the Invention

The invention relates to a modulation device for use in a charged particle multi-beamlet lithography system. The invention further relates to a charged-particle multi-beamlet lithography system.

2. Description of the Related Art

Charged particle multi-beamlet systems are known, for example from U.S. Pat. No. 6,958,804. The system described in this patent preferably uses a plurality of electron beamlets to transfer a pattern to a target surface. The electron beamlets generated by a radiation source are modulated in a modulation device by electrostatic deflection in accordance with pattern data. The modulated beamlets are then transferred to the target surface. To enable high speed transfer of the pattern to the target surface, the pattern data for controlling the electrostatic deflection are transferred at least partly using optical transmission using modulated light beams.

BRIEF SUMMARY OF THE INVENTION

It is an object of the present invention to provide optically transmitted modulated light beams in a multi-beamlet charged particle lithography system that takes account of the limited space that is available within such system. This object has been achieved by providing a charged-particle multi-beamlet lithography system for transferring a pattern onto the surface of a target using a plurality of charged particle beamlets, the system comprising: a beam generator for generating a plurality of charged particle beamlets; a beamlet blanker array for patterning the plurality of beamlets in accordance with a pattern, the beamlet blanker array comprising a substrate provided with a first area comprising one or more modulators and a second area free of modulators and comprising one or more light sensitive elements, the one or more light sensitive elements being electrically connected to the one or more modulators and being arranged to receive light beams carrying pattern data and to provide the received pattern data to the one or more modulators; an optical fiber arrangement for guiding the light beams carrying pattern data towards the one or more light sensitive elements, the optical fiber arrangement comprising a plurality of optical fibers; and a projection system for projecting the patterned beamlets onto the target surface; wherein a projection of the optical fiber arrangement onto a surface of the beamlet blanker array in a direction perpendicular to the surface falls entirely within the second area.

Some embodiments of the invention relate to a modulation device for use in a charged-particle multi-beamlet lithography system, the modulation device comprising: a beamlet blanker array for patterning the plurality of beamlets in accordance with a pattern, the beamlet blanker array comprising a substrate provided with a first area comprising one or more modulators and a second area free of modulators and comprising one or more light sensitive elements, the one or more light sensitive elements being electrically connected to the one or more modulators and being arranged to receive light beams carrying pattern data and to provide the received pattern data to the one or more modulators; and an optical fiber arrangement for guiding the light beams carrying pattern data towards the one or more light sensitive elements, the optical fiber arrangement comprising a plurality of optical fibers, wherein a projection of the optical fiber arrangement onto a surface of the beamlet blanker array in a direction perpendicular to the surface falls entirely within the second area.

BRIEF DESCRIPTION OF THE DRAWINGS

Various aspects of the invention will be further explained with reference to embodiments shown in the drawings wherein.

DESCRIPTION OF ILLUSTRATIVE EMBODIMENTS

The following is a description of various embodiments of the invention, given by way of example only and with reference to the figures. The figures are not drawn to scale and merely intended for illustrative purposes.

Figure 1:
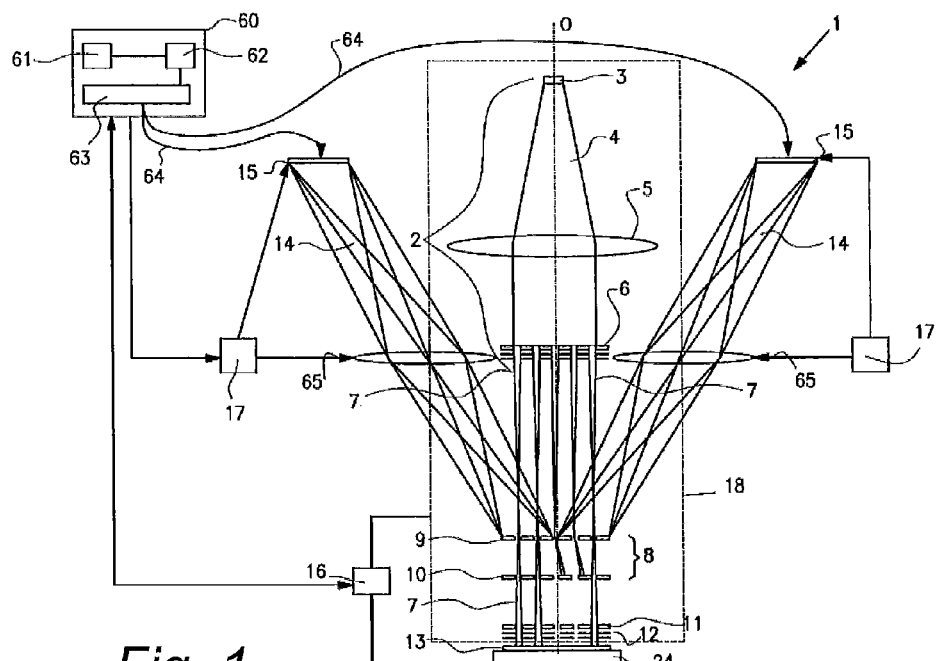
FIG. 1 schematically shows a maskless lithography system that may be used in embodiments of the invention.

FIG. 1 shows a simplified schematic drawing of an embodiment of a charged particle multi-beamlet lithography system 1. Such lithography system is for example described in U.S. Pat. Nos. 6,897,458 and 6,958,804 and 7,084,414 and 7,129,502, which are assigned to the applicant of the present application and which are hereby incorporated by reference in their entirety.

Such lithography system 1 suitably comprises a beamlet generator generating a plurality of beamlets, a beamlet modulator patterning the beamlets to form modulated beamlets, and a beamlet projector for projecting the modulated beamlets onto a surface of a target.

The beamlet generator typically comprises a source and at least one beam splitter. The source in FIG. 1 is an electron source 3 arranged to produce a substantially homogeneous, expanding electron beam 4. The beam energy of the electron beam 4 is preferably maintained relatively low in the range of about 1 to 10 keV. To achieve this, the acceleration voltage is preferably low, and the electron source 3 may be kept at a voltage between about −1 to −10 kV with respect to the target at ground potential, although other settings may also be used.

In FIG. 1 the electron beam 4 from the electron source 3 passes a collimator lens 5 for collimating the electron beam 4. The collimator lens 5 may be any type of collimating optical system. Before collimation, the electron beam 4 may pass a double octopole (not shown). Subsequently, the electron beam 4 impinges on a beam splitter, in the embodiment of FIG. 1 an aperture array 6. The aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. Note that other known methods may also be used to generate collimated beamlets. A second aperture array may be added in the system, so as to create subbeams from the electron beam 4 and to create electron beamlets 7 from the subbeam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used. In some embodiments, the substrate of the beamlet stop array 10 is formed from a silicon wafer with a regularly spaced array of through-holes, and may be coated with a surface layer of a metal to prevent surface charging. In some further embodiments, the metal is of a type that does not form a native-oxide skin, such as CrMo.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 60. The control unit 60 may comprise a data storage unit 61, a read out unit 62 and data converter 63. The control unit 60 may be located remote from the rest of the system, for instance outside the inner part of a clean room. Using optical fibers 64, modulated light beams 14 holding pattern data may be transmitted to a projector 65 which projects light from the ends of fibers within a fiber array (schematically depicted as plate 15) into the electron optical portion of the lithography system 1, schematically denoted by the dashed box and reference number 18.

In the embodiment of FIG. 1, the modulated light beams are projected on to the beamlet blanker array 9. More particularly, the modulated light beams 14 from optical fiber ends are projected on corresponding light sensitive elements located on the beamlet blanker array 9. The light sensitive elements may be arranged to convert the light signal into a different type of signal, for example an electric signal. A modulated light beam 14 carries a portion of the pattern data for controlling one or more blankers that are coupled to a corresponding light sensitive element. Suitably, in order to project the light beams 14 onto corresponding light sensitive elements optical elements such as a projector 65 may be used. Additionally, to allow projection of the light beams 14 at a suitable incident angle, a mirror may be included, for example suitably placed between a projector 65 and the beamlet blanker array 9. The projector 65 may be appropriately aligned with the plate 15 by a projector positioning device 17 under control of the control unit 60. As a result, the distance between the projector 65 and the light sensitive elements within the light sensitive element may vary as well.

In some embodiments, the light beams may, at least partially, be transferred from the plate towards the light sensitive elements by means of an optical waveguide. The optical waveguide may guide the light to a position very close to the light sensitive elements, suitably less than a centimeter, preferably in the order of a millimeter away. A short distance between an optical waveguide and a corresponding light sensitive elements reduces light loss. On the other hand, the use of plate 15 and a projector 65 located away from the space that may be occupied by the charged particle beamlets has the advantage that the beamlet disturbance is minimized, and the construction of the beamlet blanker array 9 is less complex.

The modulated beamlets coming out of the beamlet modulator are projected as a spot onto a target surface 13 of a target 24 by the beamlet projector. The beamlet projector typically comprises a scanning deflector for scanning the modulated beamlets over the target surface 13 and a projection lens system for focusing the modulated beamlets onto the target surface 13. These components may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface 13 positioned at a target plane. For lithography applications, the target usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface 13.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface 13.

In some embodiments, a beam protector (not shown) may be located between the target surface 13 and the projection lens arrangement 12. The beam protector may be a foil or a plate provided with a plurality of suitably positioned apertures. The beam protector is arranged to absorb the released resist particles before they can reach any of the sensitive elements in the lithography system 1.

The projection lens arrangement 12 may thus ensure that the spot size of a single pixel on the target surface 13 is correct, while the deflector array 11 may ensure by appropriate scanning operations that the position of a pixel on the target surface 13 is correct on a microscale. Particularly, the operation of the deflector array 11 is such that a pixel fits into a grid of pixels which ultimately constitutes the pattern on the target surface 13. It will be understood that the macroscale positioning of the pixel on the target surface 13 is suitably enabled by a wafer positioning system present below the target 24.

Commonly, the target surface 13 comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. High-quality projection is therefore relevant to obtain a lithography system that provides a reproducible result. No difference in irradiation ought to result from deflection steps.

Figure 2:
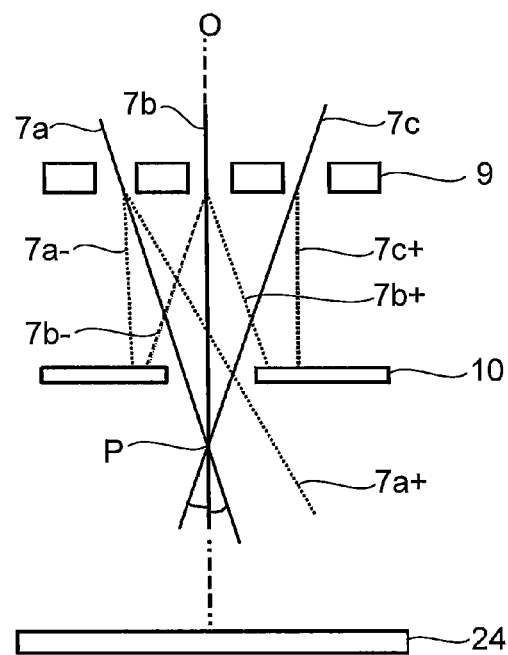
FIG. 2 schematically shows the operation of an embodiment of the beamlet blanker array in the lithography system of FIG. 1.

FIG. 2 schematically shows the operation of an embodiment of the beamlet blanker array 9 in the lithography system of FIG. 1. In particular, FIG. 2 schematically shows a cross-sectional view of a portion of a beamlet modulator comprising a beamlet blanker array 9 and beamlet stop array 10. The beamlet blanker array 9 is provided with a plurality of apertures. For sake of reference the target 24 has also been indicated. The figure is not drawn to scale.

The shown portion of the beamlet modulator is arranged to modulate three beamlets 7a, 7b, and 7c. The beamlets 7a, 7b, 7c may form part of a single group of beamlets that may be generated from a beam originating from a single source or from a single subbeam. The beamlet modulator of FIG. 2 is arranged for converging groups of beamlets towards a common point of convergence P for each group. This common point of convergence P is preferably located on an optical axis O for the group of beamlets.

Considering the shown beamlets 7a, 7b, 7c in FIG. 2, beamlets 7a, 7c have an incident angle extending between the beamlet and the optical axis O. The orientation of beamlet 7b is substantially parallel to the optical axis. The direction of beamlet deflection to establish blocking of deflected beamlets by the substrate of the beamlet stop array 10 may be different for each beamlet. Beamlet 7a is blocked by deflection towards the left, i.e. towards the "−"-direction in FIG. 2, indicated by dashed line 7a−. Beamlets 7b, 7c on the other hand are to be deflected towards the right, i.e. towards the "+"-direction, to established blocking of the respective beamlets. These blocking directions are indicated by dashed lines 7b+ and 7c+ respectively. Note that the choice of deflection direction may not be arbitrary. For example, for beamlet 7a, dashed line 7a+ shows that deflection of beamlet 7a towards the right would result in passage through the beamlet stop array 10. Therefore, deflection of beamlet 7a along line 7a+ would be inappropriate. On the other hand, deflection of beamlet 7b towards the left, indicated by dashed line 7b−, would be an option.

Figure 3A:
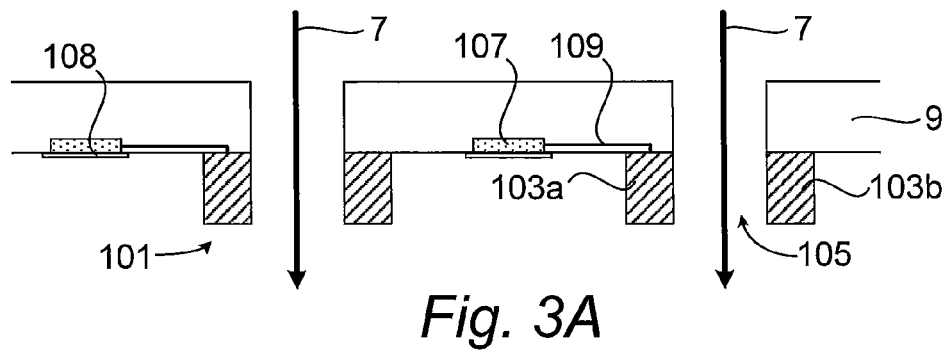
FIG. 3A schematically shows a cross-sectional view of a portion of a beamlet blanker array that may be used in the lithography system of FIG. 1.

FIG. 3A schematically shows a cross-sectional view of a portion of a beamlet blanker array 9 that may be used in the lithography system of FIG. 1. The beamlet blanker array 9 comprises a plurality of modulators 101. A modulator comprises a first electrode 103a, a second electrode 103b, and an aperture 105. The electrodes 103a, 103b are located on opposing sides of the aperture 105 for generating an electric field across the aperture.

A light sensitive element 107 is arranged to receive light beams (not shown) carrying pattern data. The light sensitive element 107 is electrically connected to one or more modulators 101 via an electrical connection 109. The light sensitive element 107 receives pattern data via the light beams, converts the light signal into an electrical signal and then forwards the received and converted pattern data via the electrical connection 109 towards the one or more connected modulators 101. The one or more modulators 101 then modulate passing charged particle beamlets, such as electron beamlets 7 in accordance with the received pattern data. The light sensitive element 107 may be provided with an anti-reflection coating 108 to reduce background radiation caused by reflected light, which may disturb a correct readout of the data carried by the light beam.

Figure 3B:
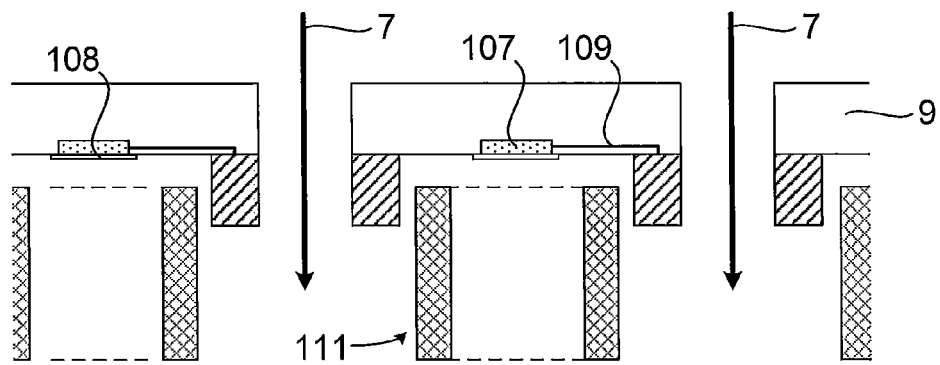
FIG. 3B schematically shows a cross-sectional view of a portion of a beamlet blanker array.

Modulation of the beamlets is thus based on controlling the application of an electric field across the apertures within the beamlet blanker array 9. However, practical use of a lithography system such as the one presented in FIG. 1 shows that effective modulation is not always possible. It turns out that the light sensitive elements 107 may act as electric field sources due to a collection of scattered electrons on their surface. This may particularly be the case if a anti-reflection coating such as coating 108 in FIGS. 3A, 3B is used. The anti-reflection coating is generally electrically insulating, which results in a relatively fast collection of scattered charged particles. Additionally, components that are used to transfer the light towards the light sensitive elements, for example optical fibers, may collect charged particles as well, in particular if they are not completely coated with a conductive coating.

The strength of electric fields caused by local collection of scattered charged particles generally depends on statistical parameters and other uncontrollable actors. Therefore, it is very difficult to predict how large the fields will be and where they will be located exactly. Experiments have shown that electric fields originating from a collection of scattered electrons can have a significant influence on position of a charged particle beamlet. This means that the beamlet position can be unstable. Furthermore, the extent of charged particle beamlet deflection may become unpredictable as well. As a result, the patterned beamlets obtained by modulation with the beamlet blanker array may not transfer a pattern that corresponds with the pattern provided to the beamlet blanker array 9 via the light beams carrying pattern data.

FIG. 3B schematically shows a cross-sectional view of a portion of a beamlet blanker array 9 provided with a shielding structure 111. The shielding structure 111 is an electrically conductive structure, and is arranged to shield electric fields and/or magnetic fields generated in proximity of the light sensitive elements 107, for example on top of an electrically insulating layer that may cover the light sensitive elements 107 for protection and/or anti-reflection purposes, from the modulators 105. In the remainder of this specification references to the expression "electric field" should be understood to mean electric and/or magnetic field.

The shielding structure 111 reduces, and preferably eliminates, the interfering of additional electric fields with the fields generated by the modulators 101. The reduction or elimination of electric field interference results in more accurate and robust modulation of the charged particle beamlets 7 by the modulators 101. The shielding structure 111 is kept at a predetermined electric potential. Preferably, the shielding structure 111 is connected to ground potential.

As can be seen in FIG. 3B, the shielding structure is not necessarily in contact with the beamlet blanker array 9. The purpose of the shielding structure 111 is to stop the electric fields generated in proximity of the light sensitive elements 107. Note that a fixed connection of the shielding structure 111 with the beamlet blanker array 9 is not essential to achieve such purpose.

Figure 3C:
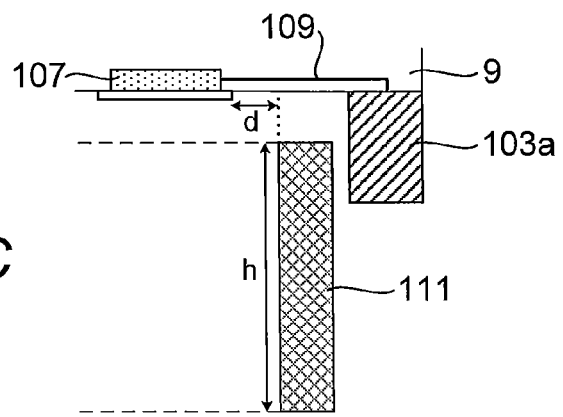
FIG. 3C schematically shows a cross-sectional view of a portion of the blanker array of FIG. 3B.

FIG. 3C schematically shows a cross-sectional view of a portion of the blanker array of FIG. 3B. In particular, FIG. 3C illustrates the ratio between the height h of the shielding structure 111 and the distance d between a light sensitive element 107 and the perpendicular projection of the shielding structure 111 onto the beamlet blanker array 9. The distance d will hereinafter be referred to as lateral shielding distance. Preferably, the height h is at least about the same as the lateral shielding distance d. Such dimensions allow to effectively shield the electric fields generated in proximity of the light sensitive elements. In particular if the height h is more than about 2.5 times the lateral shielding distance d, the influence of electric fields generated in proximity of the light sensitive elements on the operation of the modulators is negligible.

Figure 4:
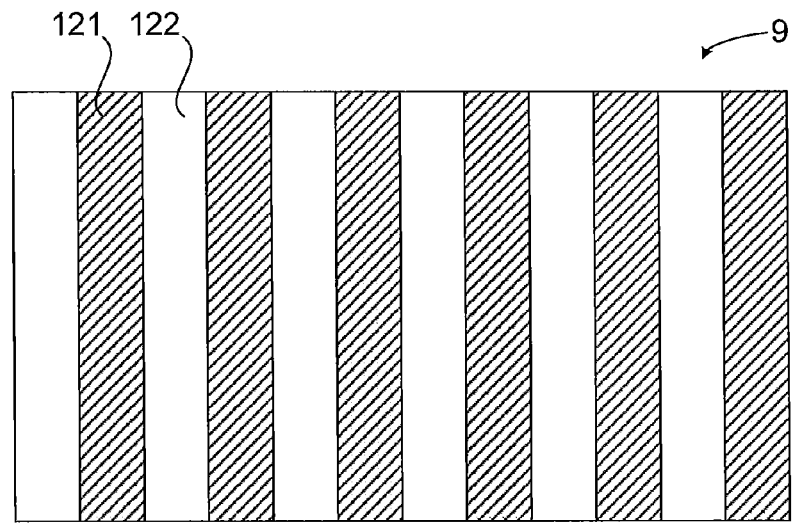
FIG. 4 schematically shows a top view of a lay-out of a beamlet blanker array that may be used in embodiments of the invention.

FIG. 4 schematically shows a top view of a lay-out of a beamlet blanker array 9 that may be used in embodiments of the invention. The beamlet blanker array 9 shown in FIG. 4 is divided into beam areas 121 and non-beam areas 122. Although the width of the beam areas 121 and non-beam areas 122 are shown to be about the same, this is not essential. The dimensions of the areas may differ based on the layout used.

The beam areas 121 include one or more modulators for modulating beamlets. The non-beam areas 122 include one or more light sensitive elements. The use of beam areas 121 and non-beam areas 122 in an optical column in a maskless lithography system has the advantage that the density of modulators and light sensitive area can be increased.

Figure 5A:
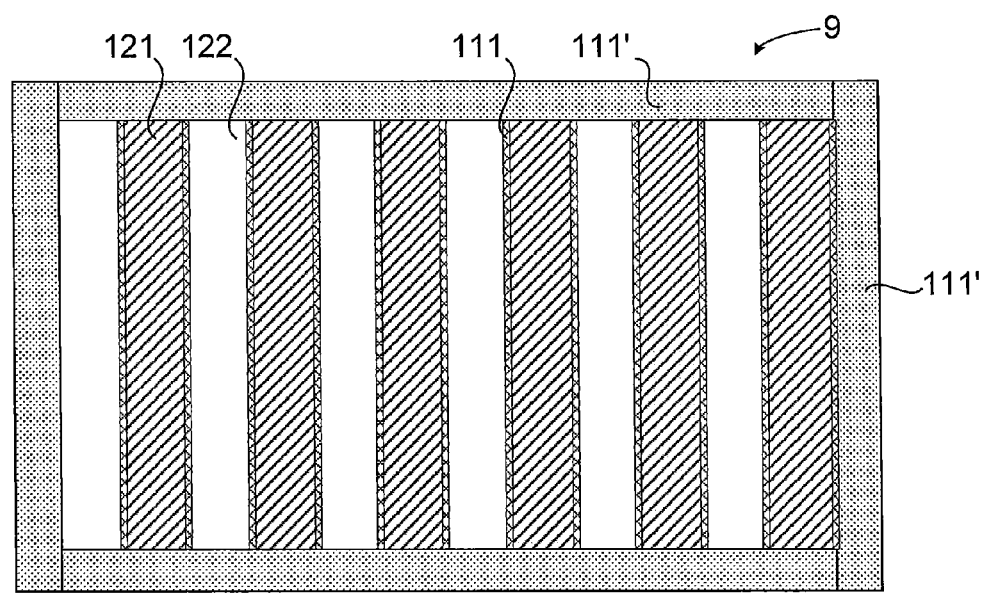
FIG. 5A schematically shows the beamlet blanker array of FIG. 3 provided with a shielding structure.

FIG. 5A schematically shows the beamlet blanker array of FIG. 4 provided with a shielding structure 111. The shielding structure 111, that is at least its projection in a direction substantially perpendicular to the beamlet blanker array surface, is located between the light sensitive elements within the non-beam areas 122 and the modulators within the beam areas 121. The shielding structure 111 is arranged to substantially shield electric fields generated in proximity of the light sensitive elements.

The shielding structure 111 of FIG. 5A can be described as comprising side walls forming an open-ended box-like structure. The side walls may be integrated into a single body, for example by connection to an additional structure 111'. A single body has the benefit of an increased mechanical robustness. Furthermore, the structure 111, 111' may be handled more easily. Integration of different components to form the shielding structure 111, 111' may be executed by adding the portions 111' to the separate walls forming the functional shielding structure 111, for example by welding. Alternatively, the shielding structure may be manufactured out of one piece, for example by using techniques such as electrical discharge machining. Yet another way of creating an integrated shielding structure 111, 111' is to attach different components to a supporting substrate. This substrate may be the beamlet blanker array 9 or a component thereof, but may also be a separate suitable substrate.

The shielding structure 111 is not necessarily physically connected to the beamlet blanker array 9. If located within sufficiently close distance of the beamlet blanker array 9 the shielding structure 111 can still sufficiently shield electric fields.

In the embodiment shown in FIG. 5A, the shielding structure 111 further includes a portion 111'. This additional portion 111' can provide mechanical support to the shielding structure 111. In some embodiments, the additional portion 111' is arranged to shield electric and/or magnetic fields originating from other potentially disturbing electric field generating sources, such as electricity cables.

Materials suitable for the shielding structure 111 are materials with sufficiently high electric conductivity. Additionally, the material should have sufficient strength and workability. An exemplary suitable material for use as main component of the shielding structure is titanium (Ti). Other exemplary materials that may be used include molybdenum (Mo) and aluminum (Al). In an exemplary embodiment, the shielding structure is made using Ti-plates coated with Mo. In another exemplary embodiment the shielding structure includes a stack of Mo sheets with Al spacers.

Figure 5B:
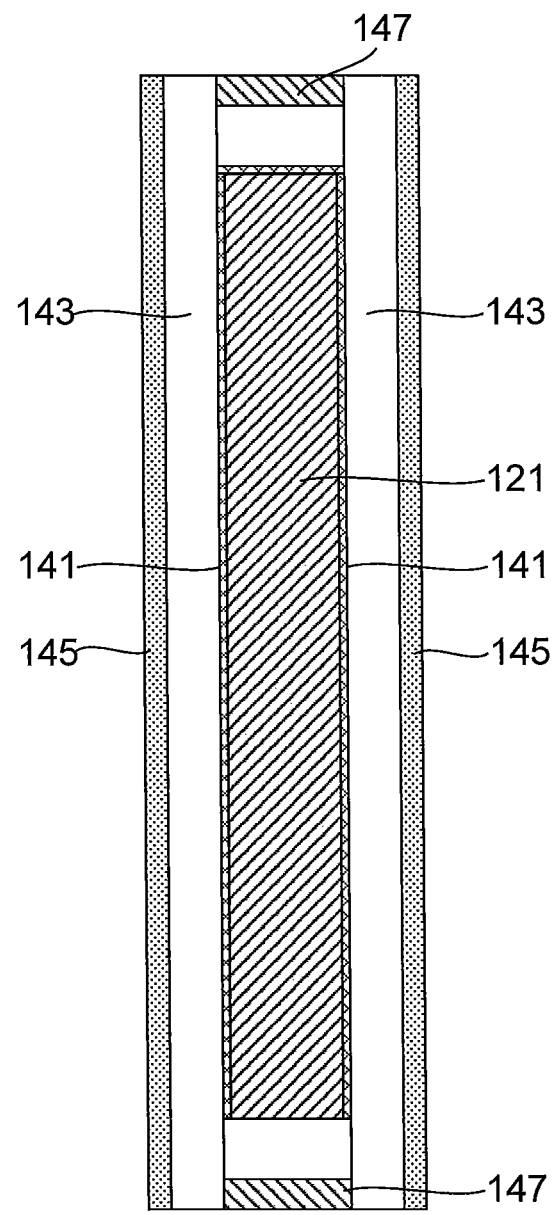
FIG. 5B schematically shows a top view of a more detailed lay-out of a beamlet blanker array that may be used in embodiments of the invention.

FIG. 5B schematically shows a top view of a more detailed lay-out of a portion of a beamlet blanker array 9 that may be used in embodiments of the invention. The blanker array portion includes a beam area 121 that may be surrounded by an area reserved for a shielding structure 141, which may be similar in size and shape as the shielding structure 111 depicted in FIG. 5A. As discussed with reference to FIG. 4, the beamlet blanker array 9 further includes a non-beam area, which effectively is all the space that is not reserved for the beam area 121 and, if present, the shielding structure 141. The shielding structure 141 is arranged to substantially shield electric fields that are externally generated, for example in the proximity of light sensitive elements, such as photodiodes, within the non-beam areas.

The shown embodiment of the shielding structure 141 can be described as comprising side walls forming an open-ended box-like structure. Again, the shielding structure 141 is not necessarily physically connected to the beamlet blanker array 9. If located within sufficiently close distance of the beamlet blanker array 9 the shielding structure 141 can still sufficiently shield electric fields.

Materials suitable for the shielding structure 141 are materials with sufficiently high electric conductivity. Additionally, the material should have sufficient strength and workability. An exemplary suitable material for use as main component of the shielding structure is titanium (Ti). Other exemplary materials that may be used include molybdenum (Mo) and aluminum (Al). In an exemplary embodiment, the shielding structure is made using Ti-plates coated with Mo. In another exemplary embodiment the shielding structure includes a stack of Mo sheets with Al spacers.

The beamlet blanker array portion of FIG. 5B further includes an optical interface area 143 reserved for establishing an optical interface between optical fibers arranged for carrying light signals and light sensitive elements within the beamlet blanker array 9. The light sensitive elements, such as photodiodes, are thus placed within the optical interface area 143. The optical fibers may cover the entire optical interface area 143 or a portion thereof. The optical fibers are suitably arranged so that they do not physically block electron beamlets within the beam area 121 during use of the lithography system.

Additionally, the non-beam area of the beamlet blanker array 9 includes a power interface area 145. The power interface area 145 is arranged to accommodate a power arrangement for suitably powering the light sensitive elements, and optionally other components, within the optical interface area 143. The power arrangement 145 may extend in a direction substantially perpendicular to, and away from the blanker array 9. Such arrangement 145 may enable the spread of the power lines over a large surface area, which improves the efficiency and reduces losses, e.g. due to a reduced thermal resistance caused by an increased radiation surface area.

The position of the power interface area 145 on the sides of the optical interface area 143 enables the use of relatively short power supply lines to the light sensitive elements. Consequently, the variation in voltage drop between different power lines, i.e. connections with nearby light sensitive elements versus connections with light sensitive elements further away, can be reduced.

The non-beam area may further include an additional interface area 147 to enable the accommodation of further circuitry, for example a clock and/or a control. The power arrangement within the power interface area 145 may also be arranged to provide sufficient power to the additional interface area 147.

Although FIG. 5B schematically shows a very specific lay-out of the several areas, it will be understood that it is possible to have a different lay-out. Similarly, the size and shape of the different interface areas may vary in dependence of the specific application.

As discussed with reference to FIG. 1, light beams may be directed towards the light sensitive elements by using an optical fiber array. In some embodiments, it is advantageous to keep the distance between the fiber array and the light sensitive elements relatively short to reduce light losses.

Figure 6A:
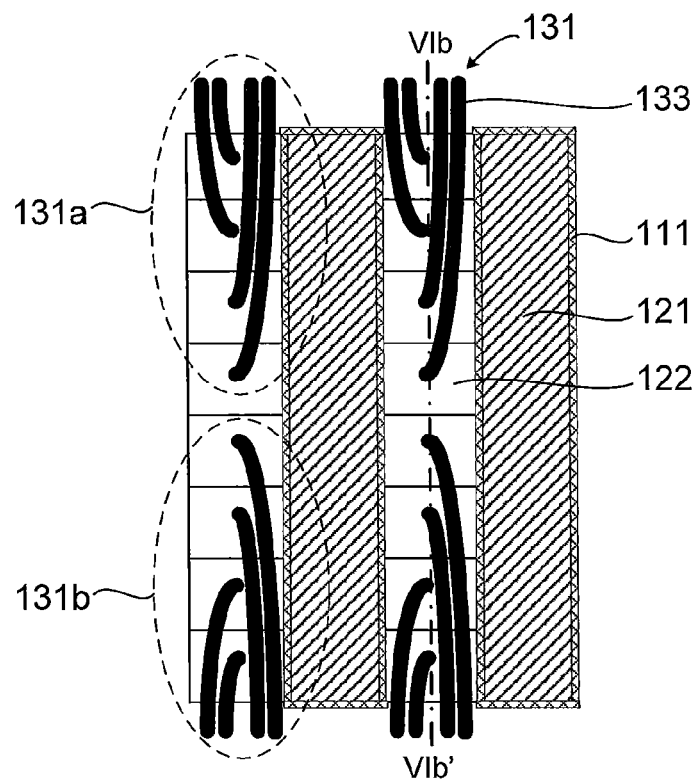
FIG. 6A schematically shows an optical fiber arrangement on top of the beamlet blanker array of FIG. 5A or 5B.

FIG. 6A schematically shows an exemplary embodiment of an optical fiber arrangement 131 selectively placed over the beamlet blanker array 9 of FIG. 5A or FIG. 5B. The optical fiber arrangement 131 comprises a plurality of optical fibers 133 arranged to guide light beams carrying pattern data towards the light sensitive elements within the non-beam areas 122. The fibers 133 are positioned such that they do not hinder a passage of charged particle beamlets arranged to pass through the apertures within the beam area 121 of the beamlet blanker array 9.

The exemplary optical fiber arrangement 131 of FIG. 6A comprises two portions per non-beam area 122. A first portion 131a comprises a number of fibers 133 that enter a space above the non-beam area 122 from one side, while the second portion 131b comprises a number of fibers 133 entering the space above the non-beam area 122 at an opposing side. The number of fibers 133 within each portion 131a, 131b may be equal to each other. The use of different portions allows for more space per fiber 133, and reduces the risk of damaging the fibers 133.

Figure 6B:
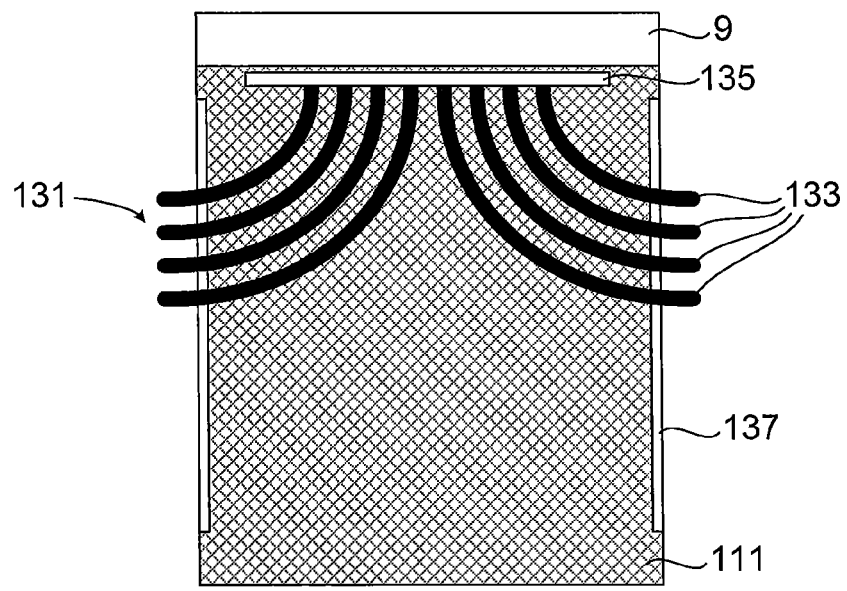
FIG. 6B schematically shows a cross-sectional view of an embodiment of the embodiment of the arrangement shown in FIG. 6A along the line VIB-VIB'.

FIG. 6B schematically shows a cross-sectional view of an embodiment of the arrangement shown in FIG. 6A along the line VIB-VIB'. The fibers 133 within the arrangement 131 terminate in a fiber array 135. The ends of the fibers within the fiber array 135 are directed towards the light sensitive elements (not shown) within the non-beam area of the beamlet blanker array 9. The fiber array 135 is preferably placed in close proximity of the surface of the beamlet blanker array 9 to minimize alignment errors due to poorly oriented fibers 133 within the fiber array 135.

In the embodiment shown in FIG. 6B, the shielding structure 111 completely embraces the non-beam area 122 to provide an effective shield for electric fields originating from locations within the non-beam area 122. As can be seen in FIG. 6B, in this embodiment one or more small openings 137 in the wall 111 are provided to allow the introduction of the fibers 133 into the enclosure. For shielding reasons, the cross-sectional area of these openings 137 is preferably as small as possible. The use of portions may help to reduce the dimensions of the cross-sectional area in a direction substantially perpendicular to the surface of the fiber array 135. However, to avoid damage to the fibers 133 due to friction and/or strain the cross-sectional area of the openings 137 may be chosen somewhat larger.

Figure 6C:
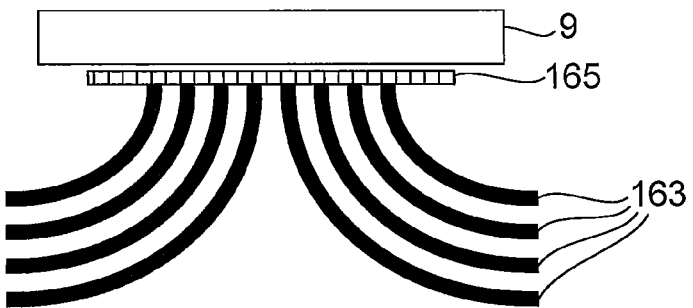
FIG. 6C schematically shows a cross-sectional view of another embodiment of the arrangement shown in FIG. 6A along the line VIB-VIB'.

FIG. 6C schematically shows a cross-sectional view of another embodiment of the arrangement shown in FIG. 6A along the line VIB-VIB'. In this embodiment, the fibers 163 within the arrangement 161 also terminate in a fiber fixation substrate 165 forming a fiber array. The ends of the fibers within the fiber fixation substrate 165 are directed towards the light sensitive elements (not shown) within the non-beam area of the beamlet blanker array 9. Note that in this embodiment a shielding structure is absent.

Figure 6D:
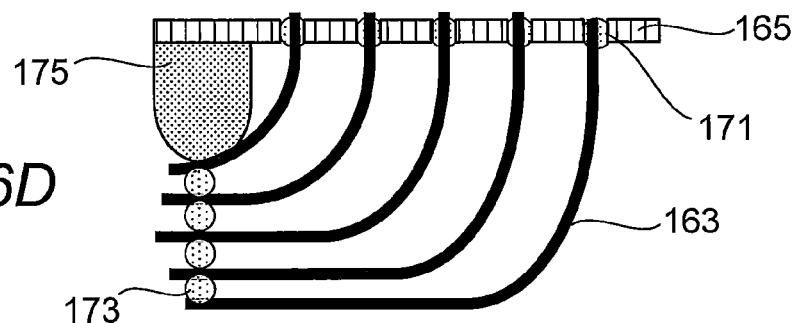
FIG. 6D schematically shows a more detailed view of an embodiment of the optical fiber arrangement that may be used in both the embodiments of FIGS. 6B and 6C.

FIG. 6D schematically shows a more detailed view of an embodiment of the optical fiber arrangement that may be used in both the embodiments of FIGS. 6B and 6C. In the embodiment of FIG. 6D, the fiber fixation substrate 165 comprises a substrate with a plurality of suitably placed apertures, for example by using semiconductor processing techniques such as etching. The fibers 163 are positioned in the apertures and fixed by using an adhesive material 171, for example suitable glue. Preferably, the height differences of the fibers 163 extending through the apertures in the fixation substrate 165 is less than 0.2 microns. This may be achieved by polishing the substrate after placement and fixing of the fibers 163.

The fibers 163 may be guided towards the apertures via a supporting unit 175. The supporting unit 175 may simplify the bending of fibers 163. Furthermore, the presence of the supporting unit 175 may avoid that defects, such as kinks, develop during the bending process. The entire arrangement of fibers 163 and substrate 165 may be strengthened even further by connecting the fibers 163 to each other, and preferably also to the supporting unit 175, for example by using an adhesive 173. The adhesive 175 used within the apertures of the substrate 165 may be the same as the adhesive 173 used to fix the fibers 163 to each other and, preferably, to the supporting unit 175. Fixing the fibers 163 into the fixation substrate 165 provides a robust fiber array which provides a reliable light output. Fixing the fibers 163 to each other, and preferably also to the supporting unit 173, if present, further improves the robustness of the design.

Figure 7A:
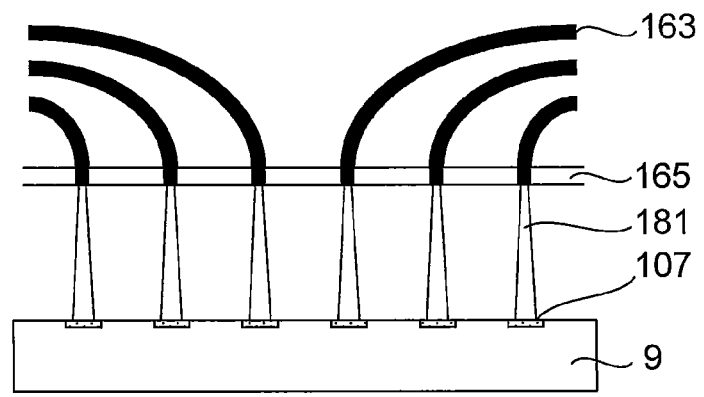
FIG. 7A schematically shows a more detailed view of the alignment between optical fibers within the fiber fixation substrate of FIG. 6C and corresponding light sensitive elements.

FIG. 7A schematically shows a more detailed view of the alignment between optical fibers 163 within the fiber fixation substrate 165 of FIG. 6C (although it may equally well apply to the fiber array 135 of FIG. 6B) and corresponding light sensitive elements 107 within the non-beam area of the blanker array 9. The fiber fixation substrate 165 is placed in close proximity to the light sensitive elements 107, preferably at a distance smaller than about 100 microns, more preferably at a distance smaller than about 50 microns. Due to the short distance between the light sensitive elements 107 and the fiber ends, optical communication with reduced light loss can be achieved. For example, such position minimizes alignment errors due to poorly oriented fibers 163 within the fiber fixation substrate 165.

The alignment of the fibers 163 in the fiber fixation substrate 165 and the light sensitive elements 107 in the blanker array 9 is preferably fixed. This can be done after an alignment procedure, which may include the use of markers, such as optical markers, on the blanker array 9. Alternatively, both the fiber fixation substrate 165 and the array of light sensitive elements 107 on the blanker array 9 are manufactured with sufficient precision that alignment of the two structures with respect to each other leads to sufficient alignment between corresponding fibers 163 and light sensitive elements 107. In case test results before actual operation of the lithography system show that a combination of a specific fiber 163 and a corresponding light sensitive element 107 does not perform according to the predetermined specifications, such combination may be excluded by the control unit during lithographic processing.

Figure 7B:
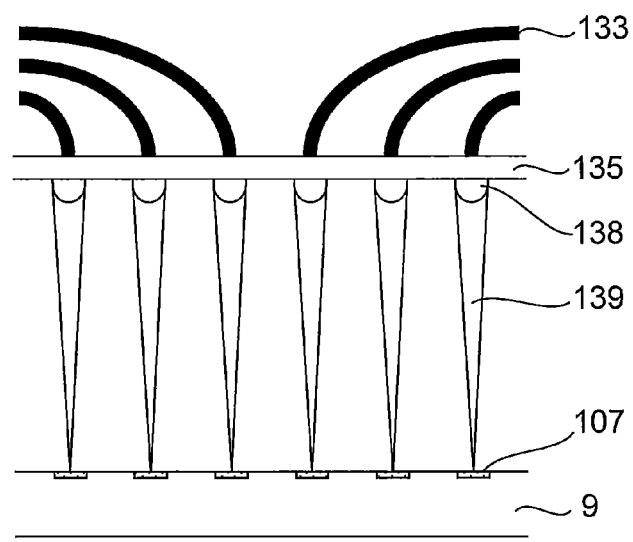
FIG. 7B schematically shows a more detailed view of alignment of the optical fiber arrangement of FIG. 6B.

FIG. 7B schematically shows a more detailed view of alignment of the optical fiber arrangement of FIG. 6B (although it may equally well apply to the fiber fixation substrate 165 of FIG. 6C). As can be seen in FIG. 7B, the fibers 133 within the fiber array 135 are substantially aligned with corresponding light sensitive elements 107 located in the non-beam area of the beamlet blanker array 9.

In the embodiment shown in FIG. 7B, the fiber array 135 includes an array of microlenses 138. The use of microlenses 138 improves optical communication. The microlenses 138 are arranged to focus light leaving the respective fibers 133 onto the light sensitive element 107. The microlenses 138 thus reduce the spot size of the light beam 139 at the light receiving surface of the light sensitive element 107. The use of microlenses alleviates alignment requirements between fiber array 135 and the light sensitive elements 107. A small deviation of the reduced spot size can still be handled by the light sensitive element because most, if not all, light leaving the respective fiber 133 still falls onto its light receiving surface.

Instead of using microlenses 138 the fiber array 135 may be placed in close proximity of the light sensitive elements 107 to achieve communication with reduced light loss. An example of such arrangement is shown in FIG. 7A. Such arrangement has the advantage that it is less complex due to the absence of the microlenses 138.

Figures 8A, 8B:
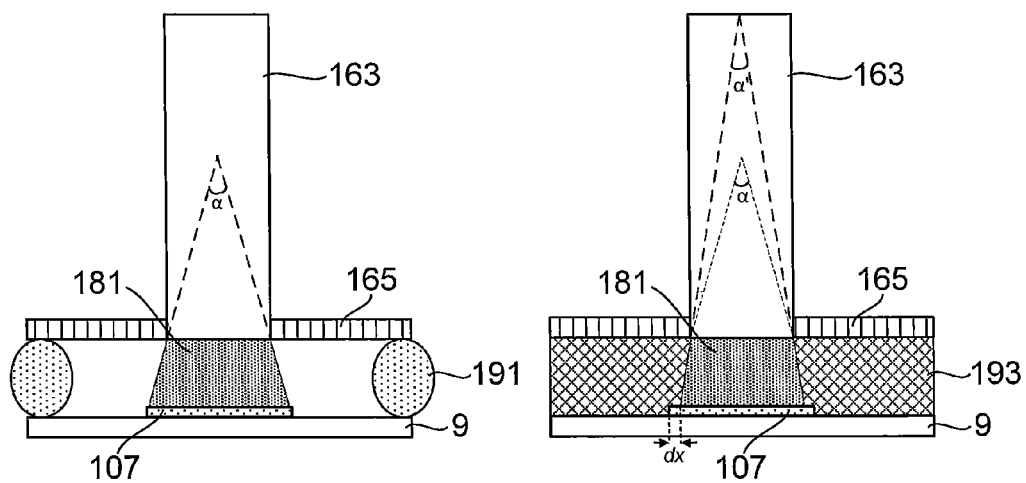
FIGS. 8A, 8B schematically show two different ways of fixing a fiber fixation substrate forming a fiber array to a blanker array.

FIGS. 8A, 8B schematically show two different ways of fixing a fiber fixation substrate 165 forming a fiber array to a blanker array 9. In both Figures, only a single combination of fiber 163 and light sensitive element 107 is shown.

In FIG. 8A the fiber fixation substrate 165 is connected to the blanker array 9 by using an adhesive 191. The adhesive 191 may be a suitable glue, for example an epoxy glue. The adhesive 191 contacts the blanker array 9 such that there is no contact between the adhesive and the light sensitive element 107. This way of fixing allows for the use of small quantities of adhesive, and is easy to execute.

As also shown in FIG. 7A, in the absence of microlenses, the light beams 181 exiting the fibers 163 diverge. As a result, the beam spot size on the surface of the blanker array 9 increases with an increase of the distance between the fiber fixation substrate 165 and the blanker array 9. Furthermore, the light intensity of the beam spot per unit area decreases. Therefore, an increase in distance reduces the amount of light that can be captured by the light sensitive element 107. Since a light sensitive element 107 needs to be capable of capturing a certain minimum amount of light for proper operation, alignment errors may have more profound effect in case the distance between the fiber fixation substrate 165 and the blanker array 9 becomes too large.

In some cases, in particular when it is not desirable to reduce the distance between the fiber and the light sensitive element, fixing is preferably done using a suitable transparent adhesive layer 193, sometimes referred to as underlay, as schematically shown in FIG. 8B. The transparent adhesive layer 193 is in contact with a large portion of both the blanker array 9 and the fiber fixation substrate 165, and may act as a filler effectively filling the gap between the blanker array 9 and the substrate 165.

Contrary to adhesive 191 shown in FIG. 8A, the adhesive layer 193 is also in contact with the light sensitive element 107. The material within the adhesive layer 193 has a sufficiently high refractive index which reduces the opening angle of the light beam 181 exiting the optical fiber 163.

The use of the adhesive layer 193 with a sufficiently high refractive index has the advantage that the alignment tolerance is improved. For example, in FIG. 8A, the light beam 181 exiting the optical fiber 163 has an opening angle $\alpha$ that is such that the light sensitive element 107 is entirely covered. However, if the alignment between the optical fiber 163 and the light sensitive element 107 is not perfect, a portion of the light will not fall onto the light sensitive element 107. Consequently, the light output received by the light sensitive element 107 readily decreases upon imperfect alignment.

In FIG. 8B, due to the presence of the adhesive layer 193 comprising a material with a sufficiently high refractive index, the opening angle of the light exiting the fiber 163 has an opening angle $\alpha'$, where $\alpha'$ is smaller than $\alpha$. The smaller opening angle reduces the spot size of the beamlet that falls onto the light sensitive element, while the light output of the spot is the same. Consequently, as schematically shown in FIG. 8B, even in case the optical fiber 163 and the light sensitive element are misaligned over a distance dx, the light sensitive element 107 still captures the entire beam 181, and the light output received by the light sensitive element merely starts to reduce if misalignment becomes greater than such distance dx. The embodiment shown in FIG. 8B is thus less susceptible to reduced performance caused by small alignment errors.

A suitable material for the adhesive layer 193 is an epoxy adhesive or glue substantially transparent to the light emitted by the fiber 163 and having a sufficiently high refractive index, for example higher than 1.4, preferably higher than about 1.5.

It will be recognized that other fixing constructions may be used as well. For example, the fiber fixation substrate 165 and the blanker array 9 may be fixed together by using connector elements such as Dowel pins.

Furthermore, at least one of the beamlet blanker array and the fixated fiber substrate may be provided with one or more mutual locating elements. Examples of such location elements include, but are not limited to a protrusion and a stop.

Figure 9:
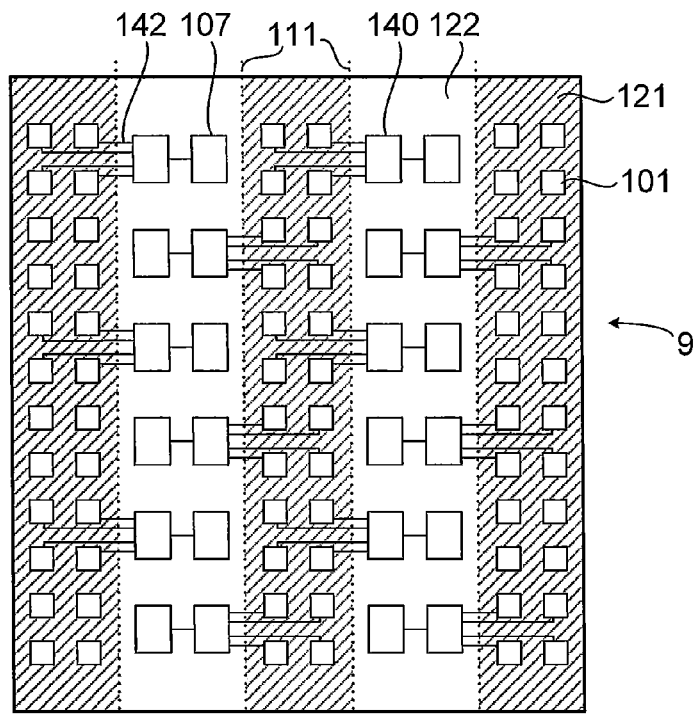
FIG. 9 schematically shows a top view of a topographic arrangement of a beamlet blanker array.

FIG. 9 schematically shows a top view of a topographic arrangement of a beamlet blanker array 9. The beamlet blanker array 9 is again divided in beam areas 121 and non-beam areas 122. In FIG. 9, the beam areas 121 and the non-beam areas 122 are separated by walls forming a shielding structure 111 as discussed earlier.

The beam areas 121 comprise a plurality of modulators 101. The non-beam areas 122 comprise a plurality of light sensitive elements 107. Suitable examples of the light sensitive elements 107 include but are not limited to photodiodes and phototransistors.

The non-beam areas 122 further include demultiplexers 140. In this embodiment, the light signals received by the light sensitive elements 107 are multiplexed signals which include information for more than one modulator 101. A signal received by a light sensitive element 107 is transferred to a demultiplexer 140. The demultiplexer 140 demultiplexes the signal and forwards demultiplexed signals to the correct modulators 101 via dedicated electrical connections 142.

As a result of multiplexed light signals, demultiplexers 140 and demultiplexed electrical signals, the number of light sensitive elements 107 is lower than the number of modulators 101. Having a limited number of light sensitive elements 107 enables reduction of the dimensions of the non-beam areas 122. The beam areas 121 may then be placed more closely together to increase the number of modulators 101 per unit area in the blanker array 9. In comparison to a non-multiplexed embodiment the lay-out of the beamlet blanker array 9 would then be more compact if the same number of modulators 101 would be used. If the dimensions of the blanker array 9 would remain substantially the same, more modulators could be used. Alternatively, instead of decreasing the size of the non-beam areas 122 the use of a multiplexed embodiment as shown in FIG. 9 could enable the use of light sensitive elements 107 with a greater light receiving area. The use of a greater light receiving area per light sensitive element 107 reduces the complexity of the optics needed to direct the light signal towards the correct light sensitive elements 107 and may alleviate requirements related to the alignment of light beams and light sensitive elements 107.

Figure 10:
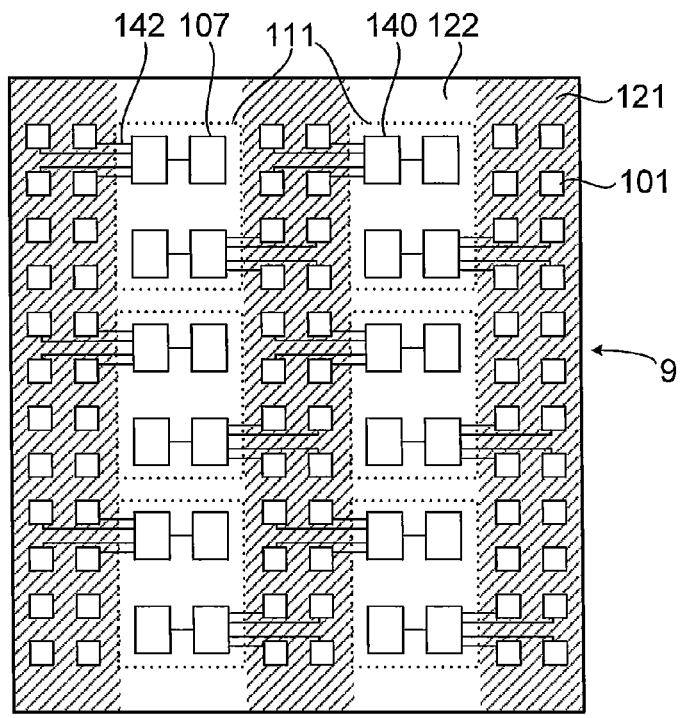
FIG. 10 schematically shows a top view of another topographic arrangement of a beamlet blanker array.

FIG. 10 schematically shows a top view of another topographic arrangement of a beamlet blanker array 9. In contrast to the embodiment shown in FIG. 9, the shielding structure 111 now embraces a portion of the light sensitive elements 107 and the demultiplexers 142 within a non-beam area 122. This modular approach has the advantage that malfunctioning channels and/or components like demultiplexers 142 can be more easily corrected for.

Figure 11:
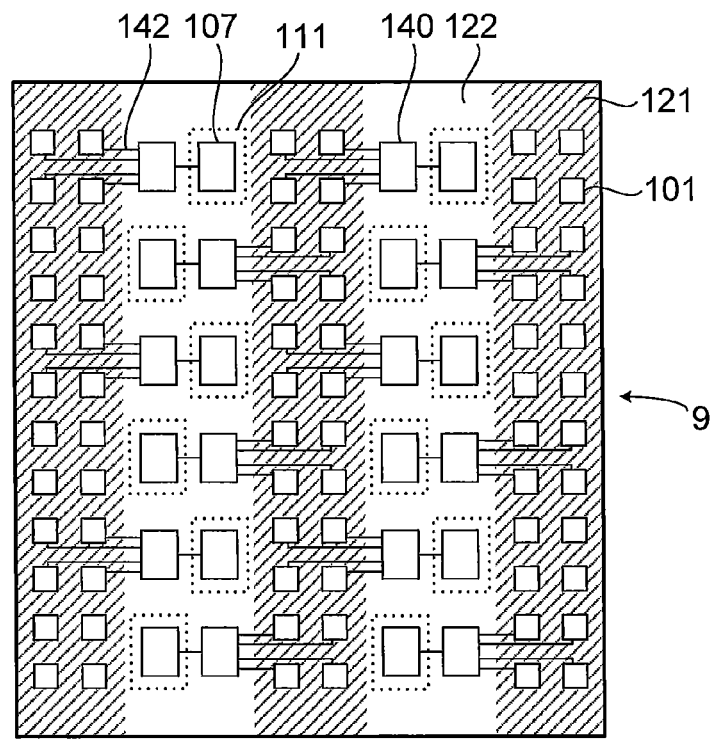
FIG. 11 schematically shows a top view of yet another topographic arrangement of a beamlet blanker array.

FIG. 11 schematically shows a top view of yet another topographic arrangement of a beamlet blanker array 9. In contrast to the embodiment shown in FIG. 10, the shielding structure 111 now merely embraces the light sensitive elements 107 within a non-beam area 122.

Note that, although the preceding embodiments, in particular the embodiments described with reference to FIGS. 6A-6D, were directed to transfer of light beams carrying pattern data towards a location in proximity of the light sensitive elements via optical fibers, such pattern data may be transferred using free space optics, in particular in the area close to the beamlet blanker array. The use of free space optics has the advantage that no space needs to be reserved for the accommodation of fibers. Furthermore, different light paths may be created by using optical elements like mirrors. The use of optical elements in free space optics increases the flexibility of forming light paths. The mechanical limitations of optical fibers, for example a limited ability to bend in a small space, play no role.

Figure 12:
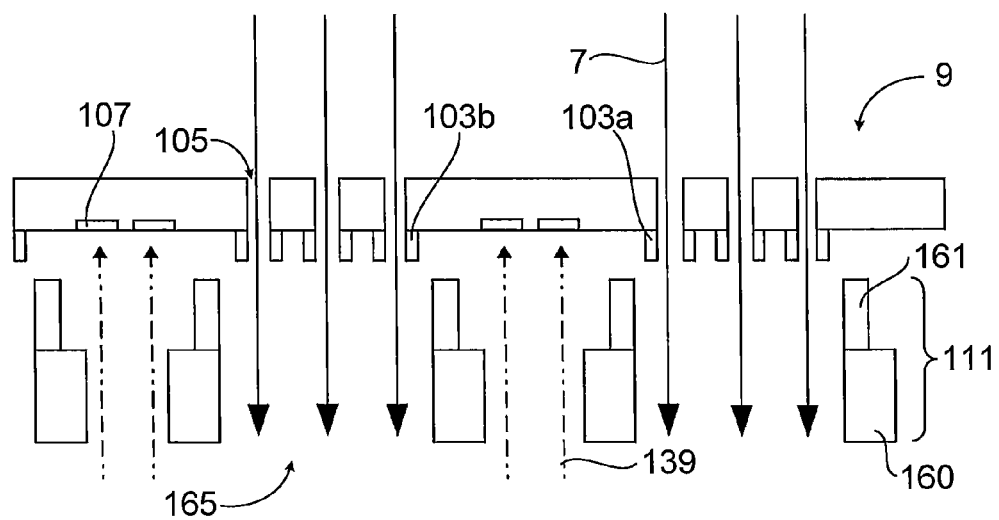
FIG. 12 schematically shows a cross-sectional view of an embodiment of a beamlet blanker array provided with a shielding structure.

FIG. 12 schematically shows a cross-sectional view of a beamlet blanker array 9 with an embodiment of a shielding structure 111 using free space optics. The light beams 139, indicated herein with dashed-dotted arrows have an incident angle of approximately 90 degrees. Note that this is not essential.

The particular embodiment of the shielding structure 111 shown in FIG. 12 includes a substrate 160 provided with side walls 161 extending thereon. The side walls 161 are located adjacent to apertures 165 within the substrate 160 that are aligned with one or more apertures 105 within the beamlets blanker array 9. Note that although the beamlets 7 in FIG. 12 pass the beamlet array 9 substantially perpendicular, this is not essential.

The side walls 161 are suitably made of conductive material. In some embodiments, a side wall 161 is arranged circumferentially around an aperture 165. In some other embodiments, a side wall 161 is arranged circumferentially around a lateral area defined by the one or more light sensitive elements 107. In such case, a structure of side walls 161 may be provided, including a side wall extending around the lateral area of light sensitive elements and a side wall extending around the aperture 165. The shielding structure 111 does not have to be sealed to the beamlet blanker array 9.

The embodiment of the shielding structure 111 is in particular suitable for a topographical arrangement as schematically shown in FIG. 9. The long extension of the side walls in one direction (in FIG. 9 a vertical direction), height requirements of the shielding structure 111 do not have a significant effect on the angle at which the data carrying light beams can be directed onto the light sensitive elements 107. In particular, if a design is used where the height of the shielding structure is substantially greater than the lateral shielding distance introducing the light from directions with a significant component substantially perpendicular to the direction of the walls forming the shielding structure limits the angle at which light can reach the light sensitive elements 107.

The long extension of the shielded area in the direction of the side walls forming the shielding structure 111 now ensures that such limited possible entry of light beams only occurs if the beams originate from a direction with a significant component substantially perpendicular to the side wall orientation. The angles at which light can couple into the shielded area when incident from a direction substantially parallel to the side wall orientation may vary widely as no significant shielding is needed in these directions.

Figure 13:
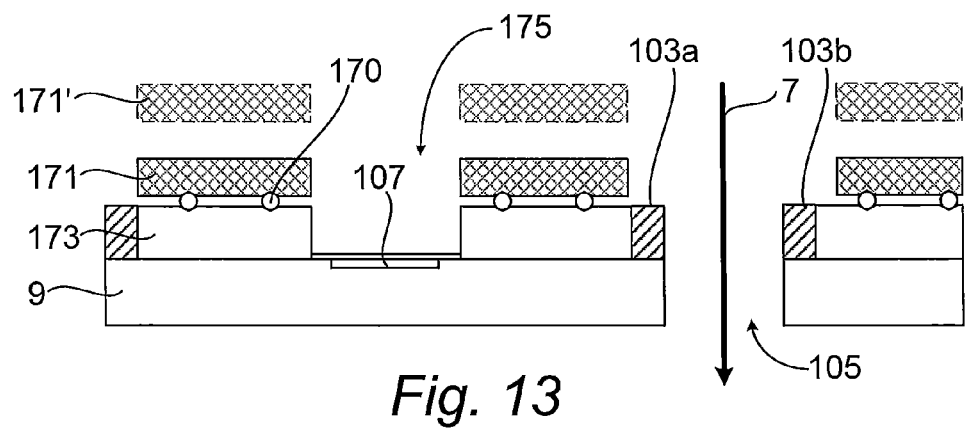
FIG. 13 schematically shows a cross-sectional view of another embodiment of a beamlet blanker array provided with a shielding structure.

As mentioned earlier, the shielding structure 111 does not necessarily be physically connected to the beamlet blanker array 9. However, in some embodiments both structures are connected. For example, FIG. 13 shows an embodiment in which the shielding structure 111 is connected to the blanker array 9 using solder balls 170. The solder balls 170 may extend through a passivation layer (not shown) that is commonly used in IC manufacturing. The use of such soldering connection may be particularly suitable for embodiments of the shielding structure 111 that embrace a relatively small area, for example embodiments having a topographical arrangement as shown in FIGS. 10 and 11.

Furthermore, in the embodiments shown above, the shielding structure 111 is a wall-like structure having a height that is at least similar in dimensions to the lateral shielding distance. However, in some applications is may be sufficient to use a shielding structure 111 comprising a plate 171 with apertures 175. Some apertures are aligned with the apertures 105 within the beamlet blanker array 9 while others are aligned with the light sensitive elements 107 to allow illumination of these elements by the data carrying light beams (not shown).

The embodiment shown in FIG. 13 includes a beamlet blanker array 9 provided with an interconnect structure 173 arranged to enable connection of light sensitive elements 107 at different levels with the electrostatic deflectors 103a, 103b of the modulators 105. Such multi-level connection structure may reduce the modulator pitch within the beamlet blanker array 9, which can result in a more compact design.

The plate 171 may be physically connected to the beamlet blanker array 9, for example via solder balls 170, but may also be positioned at some distance, indicated in FIG. 13 by structure 171' provided with dashed contour lines. In such case, the beamlet blanker array 9 and the structure 171' may be connected to the same frame to ensure that both structures are suitably aligned with respect to each other. The distance between the structure 171' and the blanker array 9 may be suitably designed based on the desired extent of electric field shielding and the available angle for data carrying light beams to "hit" the light sensitive elements 107.

The plate 171, 171' may be a metal piece in which the apertures are shaped by punching. An example of such piece is referred to in the semiconductor industry as a leadframe. Alternatively, the plate 171, 171' may take the form of a semiconductor or ceramic substrate provided with throughholes, for example made by using one or more suitable etching techniques.

Note that the direction of the charged particle beamlet 7 is not essential. The embodiment shown in FIG. 13 may also be used while a particle beamlet 7 passes through the aperture 105 in a substantially upward direction.

Figure 14:
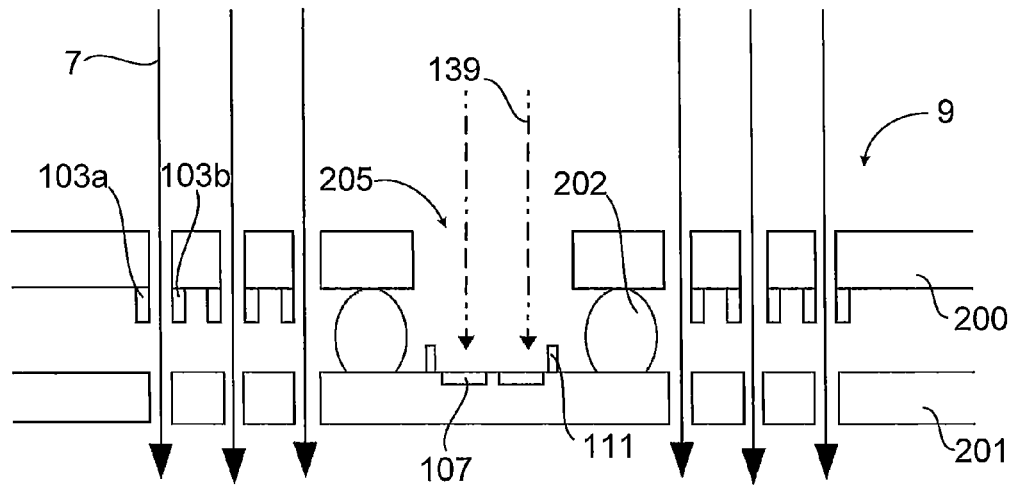
FIG. 14 schematically shows a cross-sectional view of yet another beamlet blanker array provided with a shielding structure.

FIG. 14 shows yet another embodiment of a beamlet blanker array 9 provided with a shielding structure 111. The beamlet blanker array 9 of this embodiment comprises a first substrate 200 and a second substrate 201. The modulators with deflectors 103a, 103b are defined on the first substrate 200. The light sensitive elements 107 are defined at a surface of the second substrate 201. Solder balls 202 provide mechanical connections from the first substrate 200 to the second substrate 201 and electrical connections between the light sensitive elements 107 and the deflectors 103a, 103b, and/or any intermediate circuitry. Light beams 141 now arrive at the light sensitive elements 107 from an opposite direction, e.g. the top side of the column. Thereto, radiation apertures 205 are present in the first substrate 200. In the shown embodiment the shielding structure 111 is connected to the second substrate 201, and takes the form of side walls. The side walls may extend in a single direction (see e.g. topographic arrangement of FIG. 9) or may embrace one or more light sensitive elements 107 (see e.g. topographic arrangements of FIGS. 10 and 11).

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

What is claimed is:

1. A charged-particle multi-beamlet lithography system for transferring a pattern onto the surface of a target using a plurality of charged particle beamlets, the system comprising:
   a beam generator for generating a plurality of charged particle beamlets;
   a beamlet blanker array for patterning the plurality of beamlets in accordance with a pattern, the beamlet blanker array comprising a substrate provided with a first area comprising one or more modulators for modulating the beamlets on the basis of pattern data related to the pattern to be formed onto the surface and a second area free of modulators and comprising one or more light sensitive elements, the one or more light sensitive elements being electrically connected to the one or more modulators and being arranged to receive light beams carrying the pattern data and to provide the received pattern data to the one or more modulators;
   an optical fiber arrangement for guiding the light beams carrying the pattern data, during operation of the lithography system, towards the one or more light sensitive elements, the optical fiber arrangement comprising a plurality of optical fibers; and
   a projection system for projecting the patterned beamlets onto the target surface;
   wherein a projection of the optical fibers in the optical fiber arrangement in a direction perpendicular to the beamlet blanker array surface falls entirely within the second area.

2. The system of claim 1, wherein the first area and the second area take the form of adjacent strips, each strip having two substantially parallel long sides and two substantially parallel short sides, and wherein the projection of the optical fiber arrangement onto the beamlet blanker array crosses the boundary of the second area at a short side thereof.

3. The system of claim 1, wherein the optical fiber arrangement comprises a fiber array for providing the light beams carrying pattern data as an assembled group.

4. The system of claim 1, wherein the optical fiber arrangement further comprises a plurality of microlenses, the microlenses corresponding to fibers of the plurality of fibers.

5. The system of claim 1, wherein the system further comprises a shielding structure of an electrically conductive material for substantially shielding electric fields generated in proximity to the one or more light sensitive elements from the two-dimensional array of modulators, wherein the shielding structure is arranged to be set at a predetermined potential.

6. The system of claim 2, wherein the beamlet blanker array comprises a plurality of first areas and second areas alternating in a direction perpendicular to the long sides.

7. The system of claim 3, wherein the fiber array is formed by a fiber fixation substrate which accommodates end sections of the plurality of optical fibers with a fixed connection.

8. The system of claim 7, wherein the fiber fixation substrate comprises a plurality of apertures, the fibers being positioned in the apertures and fixed to the substrate using an adhesive material.

9. The system claim 7, wherein at least two of the optical fibers are connected to each other.

10. The system of claim 8, wherein the height difference of the fibers extending through the apertures in the fixation substrate is less than 0.2 microns.

11. The system of claim 8 wherein the optical fiber arrangement further comprises a supporting unit for guiding the fibers towards the apertures.

12. The system of claim 11, wherein at least one fiber is connected to the supporting unit.

13. The system of claim 5, wherein the shielding structure comprises a wall having a length and a height, which projection onto the substrate surface of the beamlet blanker array in a direction substantially parallel to the wall height and substantially perpendicular to the wall length separates the first area from the second area.

14. The system of claim 5, wherein the shielding structure comprises side walls forming an open-ended box-like structure.

15. The system of claim 14, wherein at least one of the side walls of the shielding structure comprises an opening for accommodating entry of optical fibers into the volume embraced by the shielding structure.

16. A modulation device for use in a charged-particle multi-beamlet lithography system, the modulation device comprising:
   a beamlet blanker array for patterning the plurality of beamlets in accordance with a pattern, the beamlet blanker array comprising a substrate provided with a first area comprising one or more modulators for modulating the beamlets on the basis of pattern data so as to enable the forming of a pattern onto a target with the lithography system, and a second area free of modulators and comprising one or more light sensitive elements, the one or more light sensitive elements being electrically connected to the one or more modulators and being arranged to receive light beams carrying pattern data and to provide the received pattern data to the one or more modulators; and
   an optical fiber arrangement for guiding the light beams carrying pattern data towards the one or more light sensitive elements, the optical fiber arrangement comprising a plurality of optical fibers, wherein a projection of the optical fibers in the optical fiber arrangement in a direction perpendicular to the beamlet blanker array surface falls entirely within the second area.

17. The device of claim 16, wherein the first area and the second area take the form of adjacent strips, each strip having two substantially parallel long sides and two substantially parallel short sides, and wherein the projection of the optical fiber arrangement onto the beamlet blanker array crosses the boundary of the second area at a short side thereof.

18. The device of claim 16, wherein the optical fiber arrangement comprises a fiber array for providing the light beams carrying pattern data as an assembled group.

19. The device of claim 16, wherein the optical fiber arrangement further comprises a plurality of microlenses, the microlenses corresponding to fibers of the plurality of fibers.

20. The device of claim 16, wherein the device further comprises a shielding structure of an electrically conductive material for substantially shielding electric fields generated in proximity to the one or more light sensitive elements from the two-dimensional array of modulators, wherein the shielding structure is arranged to be set at a predetermined potential.

21. The device of claim 17, wherein the beamlet blanker array comprises a plurality of first areas and second areas alternating in a direction perpendicular to the long sides.

22. The device of claim 18, wherein the fiber array is formed by a fiber fixation substrate which accommodates end sections of the plurality of optical fibers with a fixed connection.

23. The device of claim 22, wherein the fiber fixation substrate comprises a plurality of apertures, the fibers being positioned in the apertures and fixed to the substrate using an adhesive material.

24. The device claim 22, wherein at least two of the optical fibers are connected to each other.

25. The device of claim 23, wherein the height difference of the fibers extending through the apertures in the fixation substrate is less than 0.2 microns.

26. The device of claim 23, wherein the optical fiber arrangement further comprises a supporting unit for guiding the fibers towards the apertures.

27. The device of claim 26, wherein at least one fiber is connected to the supporting unit.

28. The device of claim 20, wherein the shielding structure comprises a wall having a length and a height, which projection onto the substrate surface of the beamlet blanker array in a direction substantially parallel to the wall height and substantially perpendicular to the wall length separates the first area from the second area.

29. The device of claim 20, wherein the shielding structure comprises side walls forming an open-ended box-like structure.

30. The device of claim 29, wherein at least one of the side walls of the shielding structure comprises an opening for accommodating entry of optical fibers into the volume embraced by the shielding structure.

* * * * *